(12) United States Patent
Takeda et al.

(10) Patent No.: US 10,014,566 B2
(45) Date of Patent: Jul. 3, 2018

(54) CONNECTOR APPARATUS AND COMMUNICATION SYSTEM

(71) Applicant: SONY CORPORATION, Tokyo (JP)

(72) Inventors: Takahiro Takeda, Kanagawa (JP); Yasuhiro Okada, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 14/914,175

(22) PCT Filed: Aug. 20, 2014

(86) PCT No.: PCT/JP2014/071706
§ 371 (c)(1),
(2) Date: Feb. 24, 2016

(87) PCT Pub. No.: WO2015/049927
PCT Pub. Date: Apr. 9, 2015

(65) Prior Publication Data
US 2016/0204495 A1    Jul. 14, 2016

(30) Foreign Application Priority Data

Oct. 1, 2013    (JP) ................................. 2013-206093

(51) Int. Cl.
*H01P 5/08*    (2006.01)
*H04B 3/02*    (2006.01)
(Continued)

(52) U.S. Cl.
CPC .............. *H01P 5/087* (2013.01); *H01P 5/107* (2013.01); *H03H 7/38* (2013.01); *H04B 3/02* (2013.01); *H04B 5/0031* (2013.01)

(58) Field of Classification Search
CPC .... H01P 5/02; H01P 5/107; H01P 3/16; H01P 5/087; H01P 3/121; H01P 5/188;
(Continued)

(56) References Cited

U.S. PATENT DOCUMENTS

2006/0274992 A1    12/2006  Shimura et al.
2007/0001789 A1*   1/2007   Suarez-Gartner ......... H01P 3/14
                                                    333/239
(Continued)

FOREIGN PATENT DOCUMENTS

CN    101677145 A    3/2010
GB    2489950 A   * 10/2012   .............. H01P 3/121
(Continued)

OTHER PUBLICATIONS

Lin Li, Xiaoping Chen, Roni Khazaka, Ke Wu, "A Transition from Substrate Integrated Waveguide (SIW) to Rectangular Waveguide", Montreal, 2009, IEEE.*

(Continued)

*Primary Examiner* — Aristocratis Fotakis
(74) *Attorney, Agent, or Firm* — Chip Law Group

(57) ABSTRACT

A connector apparatus of the present disclosure is configured to include: a waveguide cable; a substrate including a waveguide structure; and a coupling section configured to electromagnetically couple an end portion of the waveguide cable to the waveguide structure. Furthermore, a communication system of the present disclosure is a communication system including: a transmitter configured to transmit high-frequency signals; a receiver configured to receive high-frequency signals; a waveguide cable configured to transmit high-frequency signals between the transmitter and the receiver; and a connector apparatus configured to connect between at least one of the transmitter and the receiver to the (Continued)

waveguide cable. A connector apparatus having the above-mentioned configuration is used as the connector apparatus.

21 Claims, 16 Drawing Sheets

(51) Int. Cl.
*H03H 7/38* (2006.01)
*H01P 5/107* (2006.01)
*H04B 5/00* (2006.01)

(58) Field of Classification Search
CPC . H01P 5/08; H01P 5/00; H01P 11/006; H03H 7/38; H04B 5/0031
See application file for complete search history.

(56) References Cited

U.S. PATENT DOCUMENTS

| | | | | |
|---|---|---|---|---|
| 2009/0269004 A1* | 10/2009 | Ono | ............... | G02B 6/4228 385/14 |
| 2009/0303145 A1* | 12/2009 | Shijo | ............... | H01P 3/121 343/767 |
| 2013/0109317 A1* | 5/2013 | Kikuchi | ............... | H04B 7/24 455/41.2 |
| 2014/0049292 A1* | 2/2014 | Popescu | ............... | G02B 6/43 327/100 |
| 2014/0077893 A1* | 3/2014 | Lee | ............... | C04B 26/18 333/33 |
| 2014/0111293 A1* | 4/2014 | Madeberg | ............... | H01P 5/08 333/246 |
| 2014/0327490 A1* | 11/2014 | Marconi | ............... | H01P 5/107 333/26 |

FOREIGN PATENT DOCUMENTS

| | | | | |
|---|---|---|---|---|
| JP | 09-246816 | 9/1997 | | |
| JP | 2003-078310 | 3/2003 | | |
| JP | 2006-340317 | 12/2006 | | |
| JP | 2008-271295 | 11/2008 | | |
| JP | 2010-141644 | 6/2010 | | |
| JP | 2011-244179 | 12/2011 | | |
| WO | WO 2011145491 A1 * | 11/2011 | ............... | H04B 7/24 |
| WO | WO 2013189513 A1 * | 12/2013 | ............... | H01P 5/087 |

OTHER PUBLICATIONS

Lin Li, Xiaoping Chen, Roni Khazaka, Ke Wu, "A Transition from Substrate Integrated Waveguide (SIW) to Rectangular Waveguide", McGill University and Ecole Polytechnique, Montreal, IEEE, 2009.*

Office Action for CN Patent Application No. 201480052953.0, dated Mar. 29, 2018, 05 pages of Office Action and 08 pages of English Translation.

* cited by examiner

FIG.1A
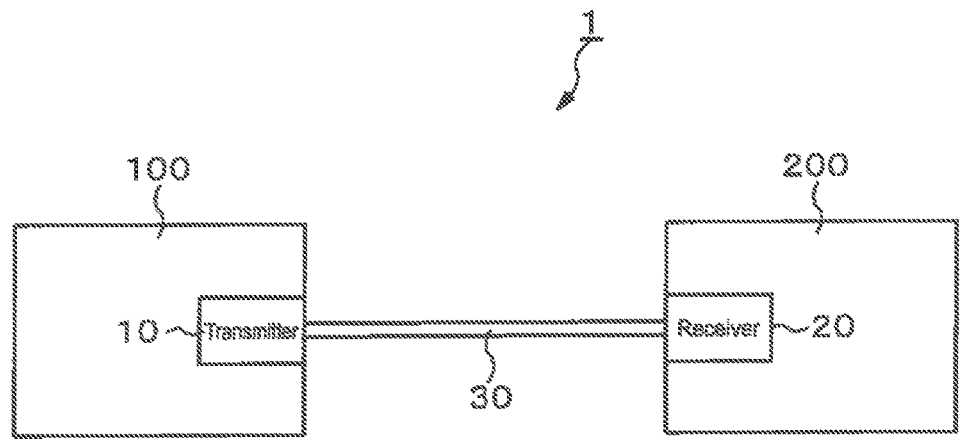
FIG.1B
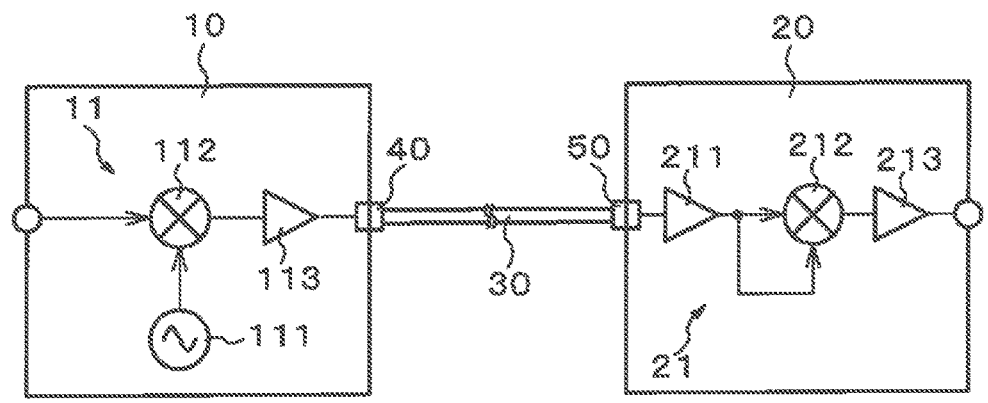
FIGS.1

FIG.5A
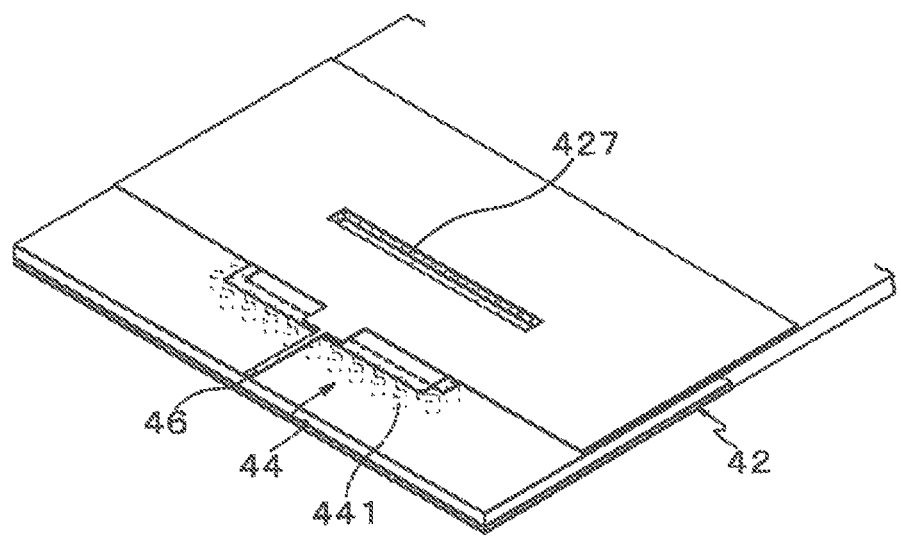
FIG.5B
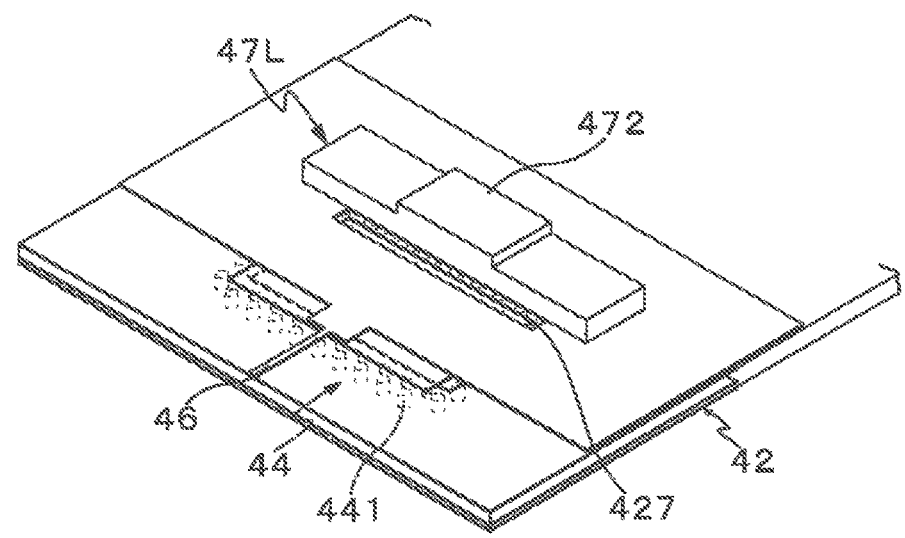
FIGS.5

FIG.6A
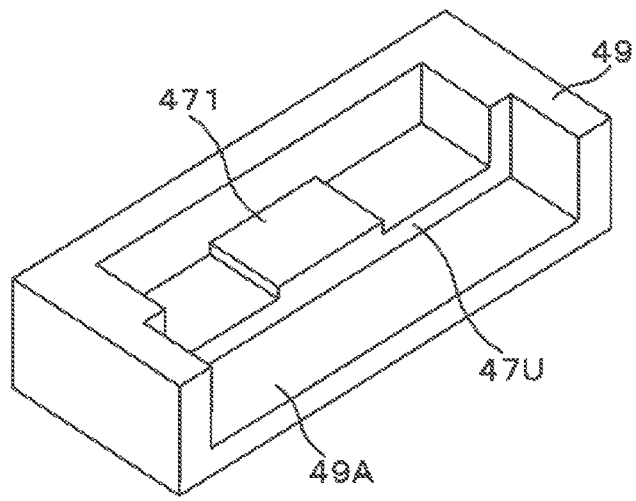
FIG.6B
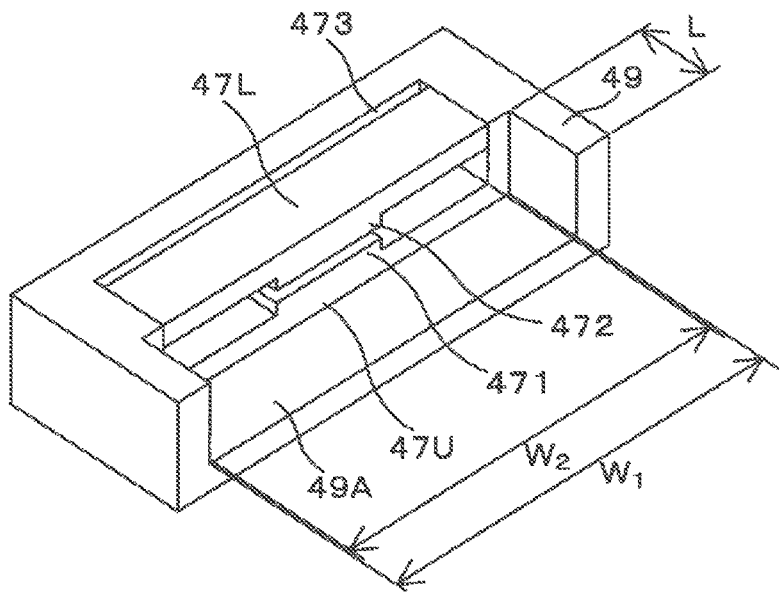
FIGS.6

FIG.7A
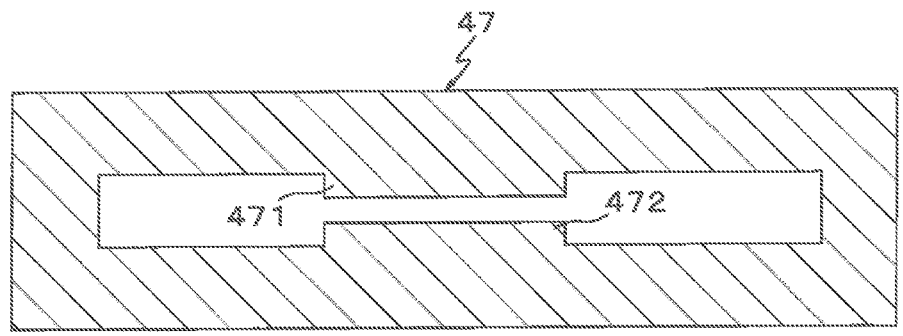
FIG.7B
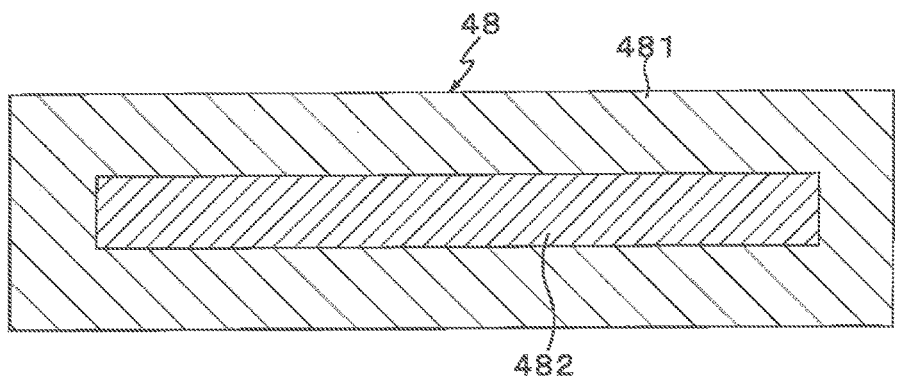
FIGS.7

CONNECTOR APPARATUS AND COMMUNICATION SYSTEM

TECHNICAL FIELD

The present disclosure relates to a connector apparatus and a communication system.

BACKGROUND ART

In a system for transmitting high-frequency signals, for example, millimeter wave or microwave signals through a waveguide cable, it is necessary to connect a feed line to the waveguide cable on a circuit board. For this connection, a dielectric waveguide-microstrip transition structure is conventionally used (e.g., see Patent Document 1). The dielectric waveguide-microstrip transition structure has a dielectric waveguide containing a dielectric block and a conductor film covering an entire surface thereof, except for a signal input/output portion. In the dielectric waveguide, a slot is formed in a bottom surface to extend in a direction perpendicular to a traveling direction. The dielectric waveguide is mounted on the circuit board via a spacer.

Patent Document 1: Japanese Patent Application Laid-open No. 2010-141644

SUMMARY

Problem to be Solved

However, in the dielectric waveguide-microstrip transition structure described in Patent Document 1, a reflection plate has to be provided on an opposite side of the traveling direction and the spacer is necessary, and hence downsizing is difficult and the number of components also increases.

It is an object of the present disclosure to provide a connector apparatus and a communication system that include a smaller number of components and can be downsized.

Means for Solving the Problem

A connector apparatus of the present disclosure for accomplishing the above-mentioned object is configured to include:
 a waveguide cable;
 a substrate including a waveguide structure; and
 a coupling section configured to electromagnetically couple an end portion of the waveguide cable to the waveguide structure.

Furthermore, the communication system of the present disclosure for accomplishing the above-mentioned object is configured to include:
 a transmitter configured to transmit high-frequency signals;
 a receiver configured to receive high-frequency signals;
 a waveguide cable configured to transmit high-frequency signals between the transmitter and the receiver; and
 a connector apparatus configured to connect between at least one of the transmitter and the receiver to the waveguide cable, in which the connector apparatus further includes
  the waveguide cable,
  a substrate including a waveguide structure, and
  a coupling section configured to electromagnetically couple an end portion of the waveguide cable to the waveguide structure.

In the connector apparatus or communication system having the above-mentioned configuration, the circuit board includes the waveguide structure. Therefore, the waveguide modes are coupled to each other between the circuit board and the waveguide cable. In the case of the mutual coupling between the waveguide modes, the electric field distribution is uniform, and hence electromagnetic waves can smoothly move. Furthermore, the structure of the coupling section configured to electromagnetically couple the end portion of the waveguide cable to the waveguide structure can be simplified. Thus, it becomes possible to reduce the number of components and achieve downsizing.

Effects

According to the present disclosure, the waveguide modes are coupled to each other between the substrate and the waveguide cable, and hence it is possible to provide a connector apparatus and a communication system that include a smaller number of components and can be downsized.

Note that the effects of the present technology are not necessarily limited to the effects described here and may be any of effects described in the present specification. Furthermore, the effects are described in the present specification merely for illustrative and not limitative and additional effects may be provided.

BRIEF DESCRIPTION OF DRAWINGS

FIG. 1A is a block diagram showing an example of a configuration of a communication system to which the technology of the present disclosure is applied and FIG. 1B is a block diagram showing an example of a specific configuration of a transmitter and a receiver in this communication system.

FIG. 5A is a perspective view showing an upper-surface structure of the substrate and FIG. 5B is a perspective view showing the upper-surface structure of the substrate in a state in which a lower portion of a ridge waveguide is placed.

FIG. 6A is a perspective view showing the lower portion of the ridge waveguide in a reversed state and FIG. 6B is a perspective view showing an upper portion and the lower portion of the ridge waveguide in the reversed state.

FIG. 7A is a sectional view showing a cross-sectional structure of the ridge waveguide having an integral structure including ridges on both upper and lower sides and FIG. 7B is a perspective view showing a cross-sectional structure of a rectangular waveguide filled with dielectric material.

MODE(S) FOR CARRYING OUT THE INVENTION

Figure 2:
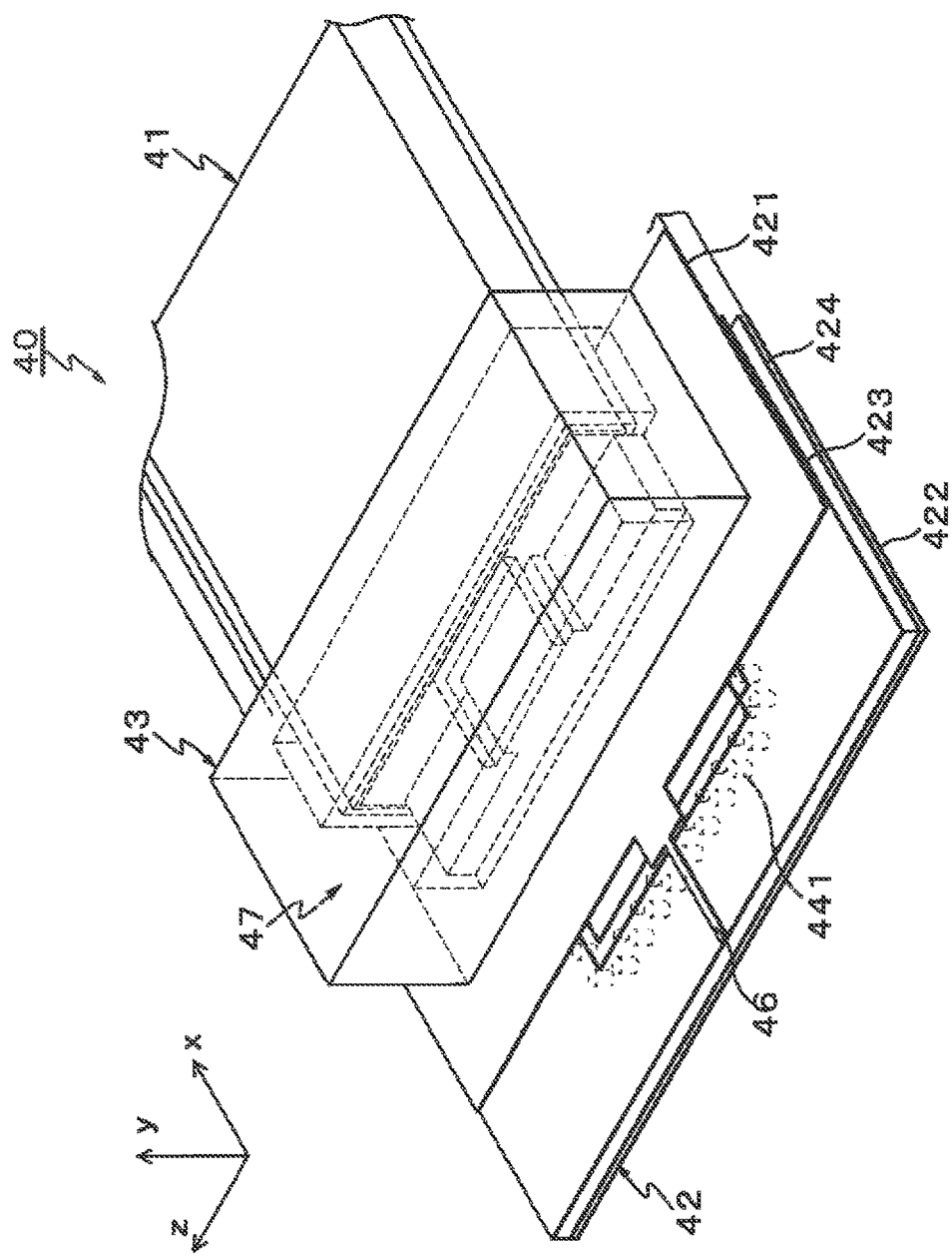
FIG. 2 is a perspective view schematically showing a configuration of a connector apparatus according to an embodiment of the present disclosure.

Hereinafter, embodiments for carrying out the technology of the present disclosure (hereinafter, referred to as "embodiments") will be described in detail with reference to the drawings. The technology of the present disclosure is not limited to the embodiments and various numerical values and the like in the embodiments are exemplary. In the following descriptions, the same elements or elements having the same functions will be denoted by the same symbols and duplicated descriptions will be omitted. Note that the descriptions will be made in the following order.
1. Description of General Connector Apparatus and Communication System of Present Disclosure
2. Communication System to which Technology of Present Disclosure is Applied
3. Description of Embodiment
   3-1. Connector Apparatus According to Embodiment
   3-2. Modified Example 1
   3-3. Modified Example 2
   3-4. Modified Example 3

Description of General Connector Apparatus and Communication System of Present Disclosure A communication system for transmitting high-frequency signals of electromagnetic waves, particularly, microwaves, millimeter waves, terahertz waves, and the like with a waveguide being a medium is favorable when used for transmitting signals between various types of apparatuses such as an electronic apparatus, an information processing apparatus, and a semiconductor apparatus, transmitting signals between circuit boards in an apparatus (device), and the like. In this communication system, the waveguide that transmits high-frequency signals functions as a cable for mutually connecting the apparatuses or the circuit boards, and hence is called waveguide cable.

For example, millimeter waves of high frequency waves are radio waves having a frequency of from 30 [GHz] to 300 [GHz](wavelength of from 1 [mm] to 10 [mm]). By performing signal transmission in a millimeter wave band, high-speed signal transmission of Gbps order (e.g., 5 [Gbps] or more) can be realized. Examples of signals that require high-speed signal transmission of Gbps order can include data signals for a movie image, a computer image, or the like. Furthermore, signal transmission in the millimeter wave band has an advantage that it is excellent in interference resistance and other electrical wires in cable connection between the apparatuses do not experience interference.

In the connector apparatus and the communication system of the present disclosure, the waveguide structure can be configured to be formed of a substrate integrated waveguide (SIW).

In the connector apparatus and the communication system of the present disclosure having the above-mentioned configuration, a configuration in which it is formed of a printed substrate with conductor layers formed on both main surfaces that are dielectric can be employed. In this case, the waveguide structure can be configured to be formed of the two conductor layers formed on the both main surfaces of the printed substrate and two conductor walls formed in particular to the main surfaces and to be opposed to each other in a traveling direction of electromagnetic waves. Furthermore, a configuration in which the two conductor walls are formed by a continuous array of columnar conductors can be employed other than a configuration in which it is formed of a single plate-like conductor. A configuration in which the columnar conductors are formed of via-holes that electrically connect the two conductor layers formed on the both main surfaces of the printed substrate can be employed.

Furthermore, in the connector apparatus and the communication system of the present disclosure having the above-mentioned configuration, a configuration in which the coupling section includes a through-hole that penetrates the conductor layer of the one main surface of the printed substrate and the end portion of the waveguide cable and the waveguide structure are electromagnetically coupled to each other via the through-hole can be employed. In this case, a configuration in which the through-hole includes a slot formed between the two conductor walls in a direction perpendicular to the traveling direction of electromagnetic waves can be employed. Here, "perpendicular" means substantially perpendicular other than strictly perpendicular, and also deviations that are caused in design or manufacture are allowed.

Furthermore, in the connector apparatus and the communication system of the present disclosure having the above-mentioned configuration, a configuration in which the coupling section includes a ridge waveguide provided between the through-hole and the end portion of the waveguide cable can be employed. Alternatively, a configuration in which the coupling section includes a rectangular waveguide filled with dielectric material (rectangular waveguide with a tube being filled with dielectric material) can be employed.

Alternatively, in the connector apparatus and the communication system of the present disclosure having the above-mentioned configuration, a configuration in which the waveguide cable is a dielectric waveguide cable with the waveguide being filled with the dielectric material can be employed.

Furthermore, in the connector apparatus and the communication system of the present disclosure having the above-mentioned configuration, a configuration in which the coupling section holds the waveguide cable in parallel to the substrate can be employed. Here, "parallel" means substantially parallel other than strictly parallel, and also deviations that are caused in design or manufacture are allowed. Alternatively, a configuration in which the coupling section holds the waveguide cable perpendicular to the substrate can be employed. Here, "perpendicular" means substantially perpendicular other than strictly perpendicular, and also deviations that are caused in design or manufacture are allowed.

Alternatively, in the connector apparatus and the communication system of the present disclosure having the above-mentioned configuration, a configuration in which a guide member configured to define the position while coupling the waveguide cable with respect to the coupling section can be employed. In this case, a configuration in which the guide member includes an insertion port into which the waveguide cable is inserted can be employed. A configuration in which a width of an inner wall of the insertion port is set to be larger than a width of an electromagnetic wave's path of the coupling section and the inner wall of the insertion port has a taper shape having a width that becomes gradually narrower from an outside toward the coupling section can be employed.

Alternatively, in the connector apparatus and the communication system of the present disclosure having the above-mentioned configuration, a configuration in which the waveguide structure of the substrate is connected to a microstrip line (MSL) via an impedance converter can be employed.

<Communication System to which Technology of Present Disclosure is Applied>

An example of a configuration of a communication system to which the technology of the present disclosure is applied (communication system of present disclosure) will be described with reference to FIGS. 1A and 1B. FIG. 1A is a block diagram showing an example of a configuration of the communication system to which the technology of the present disclosure is applied. FIG. 1B is a block diagram showing an example of a specific configuration of a transmitter and a receiver in the communication system.

As shown in FIG. 1, a communication system 1 according to this application example is configured to include a transmitter 10 that transmits high-frequency signals, a receiver 20 that receives high-frequency signals, and a waveguide cable 30 that transmits high-frequency signals between the transmitter 10 and the receiver 20.

Here, a communication system for transmitting high-frequency signals, for example, millimeter-wave band signals through the waveguide cable 30 will be described as an example. The waveguide cable 30 may be configured to be formed of a hollow waveguide or may be configured to be formed of a dielectric waveguide.

It should be noted that the following advantages can be obtained if high-frequency signals are millimeter-wave band signals (millimeter wave communication).

a) In the millimeter wave communication, the communication bandwidth can be wide, and hence the data rate can be easily made higher.

b) The frequency used for transmission can be set to greatly differ from the frequency for other base band signal processing, and the frequency interference between the millimeter waves and the base band signals is unlikely to occur.

c) The millimeter wave band has a short wavelength, and hence a waveguide structure depending on the wavelength can be made smaller. In addition, the attenuation in distance is large and diffraction is small, and hence electromagnetic shielding is easily performed.

d) In normal wireless communication, there are strict regulations on the stability of carrier waves for preventing the interference and the like. In order to realize such highly stable carrier waves, highly stable external frequency reference components, multiplication circuit, phase lock loop (PLL) circuit, and the like are used, and hence the circuit scale increases. In contrast, in the millimeter wave communication, it is possible to use carrier waves with low stability for transmission while preventing them from easily leaking out, and it is possible to prevent the circuit scale from increasing.

In the communication system 1 according to this application example for transmitting millimeter-wave band signals, the transmitter 10 performs processing of converting transmission target signals into millimeter-wave band signals and outputting them to the waveguide cable 30. The receiver 20 performs processing of receiving the millimeter-wave band signals transmitted through the waveguide cable 30 and restoring them to the original transmission target signals.

In this application example, the transmitter 10 is provided in a first communication apparatus 100 and the receiver 20 is provided in a second communication apparatus 200. In this case, the waveguide cable 30 transmits high-frequency signals between the first communication apparatus 100 and the second communication apparatus 200. In the communication apparatuses 100, 200 that transmit and receive signals through the waveguide cable 30, the transmitter 10 and the receiver 20 are combined and arranged as a pair. The system of transmitting signals between the first communication apparatus 100 and the second communication apparatus 200 may be a one-way transmission system or may be a bidirectional transmission system.

The transmitter 10 (first communication apparatus 100) and the receiver 20 (second communication apparatus 200) are arranged in a predetermined range. The high-frequency signals are the millimeter-wave band signals, and hence the "predetermined range" only needs to limit the transmission range of millimeter waves. Typically, the distance range shorter than the distance between communication apparatuses used for broadcasting and general wireless communication corresponds to the "predetermined range."

As the form in which the transmitter 10 and the receiver 20 are arranged in the predetermined range, as shown in FIG. 1A, in addition to the form in which they are arranged in different communication apparatuses (electronic apparatuses), i.e., the first communication apparatus 100 and the second communication apparatus 200, the following forms can be exemplified. For example, the transmitter 10 and the receiver 20 may be arranged in different circuit boards within a single electronic apparatus. In the case of this form, one circuit board corresponds to the first communication apparatus 100 and the other circuit board corresponds to the second communication apparatus 200.

Otherwise, a form in which the transmitter 10 and the receiver 20 are arranged in semiconductor chips within a single electronic apparatus is conceivable. In the case of this form, one semiconductor chip corresponds to the first communication apparatus 100 and the other semiconductor chip corresponds to the second communication apparatus 200. In addition, a form in which the transmitter 10 and the receiver 20 are arranged in different circuit sections on the same circuit board is conceivable. In the case of this form, one circuit section corresponds to the first communication apparatus 100 and the other circuit section corresponds to the second communication apparatus 200. Note that the form is not limited to those forms.

On the other hand, as a combination of the first communication apparatus 100 and the second communication apparatus 200, the following combinations are conceivable as examples. Note that the combinations exemplified below are merely examples and the combination is not limited to those combinations.

If the second communication apparatus 200 is a battery-driven apparatus such as a mobile phone, a digital camera, a video camera, a game console, and a remote controller, it is conceivable that the first communication apparatus 100 is a battery charger therefor or an apparatus that performs image processing and the like, which is called base station, as a combination thereof. Furthermore, if the second communication apparatus 200 is an apparatus having an outer appearance like a relatively thin IC card, it is conceivable that the first communication apparatus 100 is a card reading/writing apparatus therefor, as a combination thereof. The card reading/writing apparatus is used by being further combined with an electronic apparatus main body, for example, a digital recording/reproducing apparatus, a terrestrial television set, a mobile phone, a game console, or a computer. Furthermore, in the case of application to an imaging apparatus, for example, the first communication apparatus 100 is a main substrate, the second communication apparatus 200 is an imaging substrate, and signals are transmitted within the single apparatus (device).

Next, referring to FIG. 1B, an example of a specific configuration of the transmitter 10 and the receiver 20 will be described.

The transmitter 10 includes a signal generator 11 that, for example, processes transmission target signals and generates millimeter-wave band signals. The signal generator 11 is a signal conversion section that converts transmission target signals into millimeter-wave band signals and configured to be formed of an amplitude shift keying (ASK) modulation circuit, for example. Specifically, the signal generator 11 is configured to generate ASK modulated waves in a millimeter wave band by a multiplier 112 multiplying the millimeter-wave band signals and the transmission target signals that are supplied from an oscillator 111, and to output them via a buffer 113. A connector apparatus 40 is provided between the transmitter 10 and the waveguide cable 30.

On the other hand, the receiver 20 includes a signal recovering section 21 that, for example, processes millimeter-wave band signals that are supplied through the waveguide cable 30 and recovers the original transmission target signals. The signal recovering section 21 is a signal conversion section that converts received millimeter-wave band signals into the original transmission target signals and configured to be formed of, for example, a square wave detector circuit. Specifically, the signal recovering section 21 is configured to convert millimeter-wave band signals (ASK modulated waves) which are supplied through a buffer 211 into transmission target signals by a multiplier 212 squaring them, and to output them through a buffer 213. A connector apparatus 50 is provided between the waveguide cable 30 and the receiver 20.

It is assumed that the waveguide cable 30 is constituted of a waveguide structure that transmits millimeter waves while closing them in the waveguide and has a property of efficiently transmitting electromagnetic waves in a millimeter wave band. If the waveguide cable 30 is formed of the dielectric waveguide, it may be a dielectric waveguide configured to contain dielectric material having a relative permittivity in a predetermined range and a dissipation factor in a predetermined range, for example.

Here, regarding "the predetermined range," each of the relative permittivity and the dissipation factor of the dielectric material only needs to be in such a range that desired effects can be obtained and only needs to take a predetermined value within the range. Note that the characteristics of the dielectric waveguide depend not only on the dielectric material itself but also on the transmission path length and the frequency (wavelength) of millimeter waves. Therefore, although the relative permittivity and the dissipation factor of the dielectric material cannot be specifically defined, they can be set as follows as examples.

For transmitting millimeter-wave band signals into the dielectric waveguide at high speed, it is desirable that the relative permittivity of the dielectric material be approximately 2 to 10 (preferably, 3 to 6) and the dissipation factor be approximately 0.00001 to 0.01 (preferably, 0.00001 to 0.001). As the dielectric material that satisfies such conditions, acrylic resin-based, urethane resin-based, epoxy resin-based, silicone-based, polyimide-based, and cyanoacrylate resin-based materials can be exemplified.

Description of Embodiment

[Connector Apparatus According to Embodiment]

In this embodiment, a description will be made by exemplifying a case of application to the connector apparatus 40 provided between the transmitter 10 and the waveguide cable 30. Note that it is not limited to the application to the connector apparatus 40 provided between the transmitter 10 and the waveguide cable 30 and can also be applied to the connector apparatus 50 provided between the waveguide cable 30 and the receiver 20 as in the connector apparatus 40.

FIG. 2 is a perspective view schematically showing a configuration of the connector apparatus according to the embodiment of the present disclosure. As shown in FIG. 2, the connector apparatus 40 according to this embodiment includes a waveguide cable 41, a substrate 42 including a waveguide structure, and a coupling section 43 that electromagnetically couples an end portion of the waveguide cable 41 to the waveguide structure. In FIG. 2, a propagation direction (traveling direction) of electromagnetic waves in the waveguide cable 41 and the waveguide structure of the substrate 42 is set to an x-direction, a direction perpendicular to a main surface of the substrate 42 is set to a y-direction, and a width direction of the substrate 42 is set to a z-direction.

Figure 3:
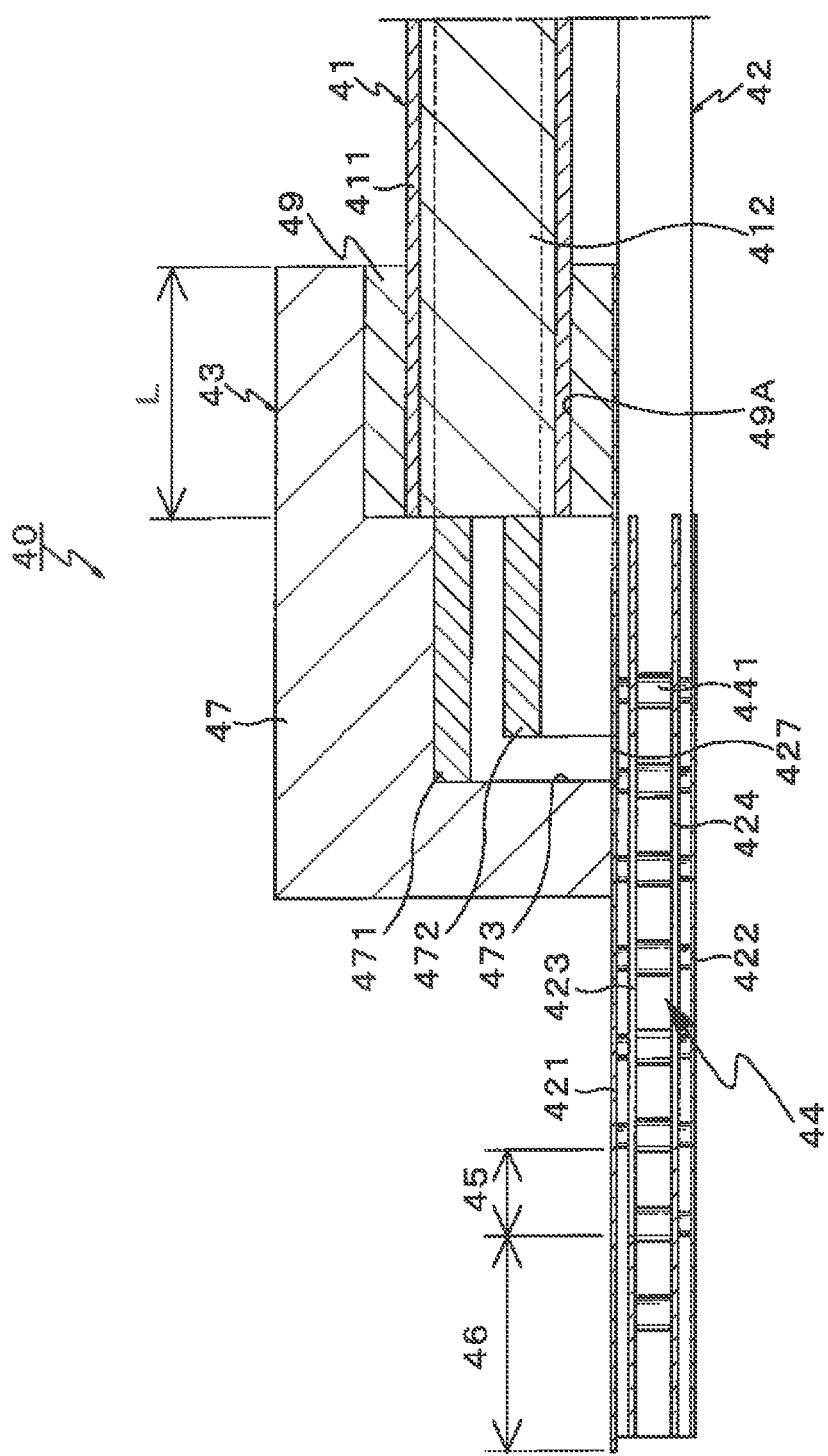
FIG. 3 is a sectional view showing a cross-sectional structure of the connector apparatus according to this embodiment that is taken along an x-direction of FIG. 2.

FIG. 3 shows a cross-sectional structure of the connector apparatus 40 according to this embodiment that is taken along the x-direction of FIG. 2. The waveguide cable 41 corresponds to the waveguide cable 30 of FIG. 1 and is formed of, for example, a dielectric waveguide obtained by filling a waveguide 411 with dielectric material 412. Note that the waveguide cable 411 is not limited to the dielectric waveguide and may be a hollow waveguide or the like.

The substrate 42 is a plate-like dielectric substrate. The substrate 42 is a printed substrate including four conductor layers (wiring layers) with conductor layers 421, 422 being formed on the both main surfaces (upper surface/lower surface) of the dielectric material, and further two conductor layers 423, 424 are formed between the both main surfaces, for example. Hereinafter, the substrate 42 will be in some cases referred to as a printed substrate 42. In this printed substrate 42, for example, the first conductor layer 421 is used as a signal line and second and third conductor layers 422, 423 are used as ground lines.

Figure 4:
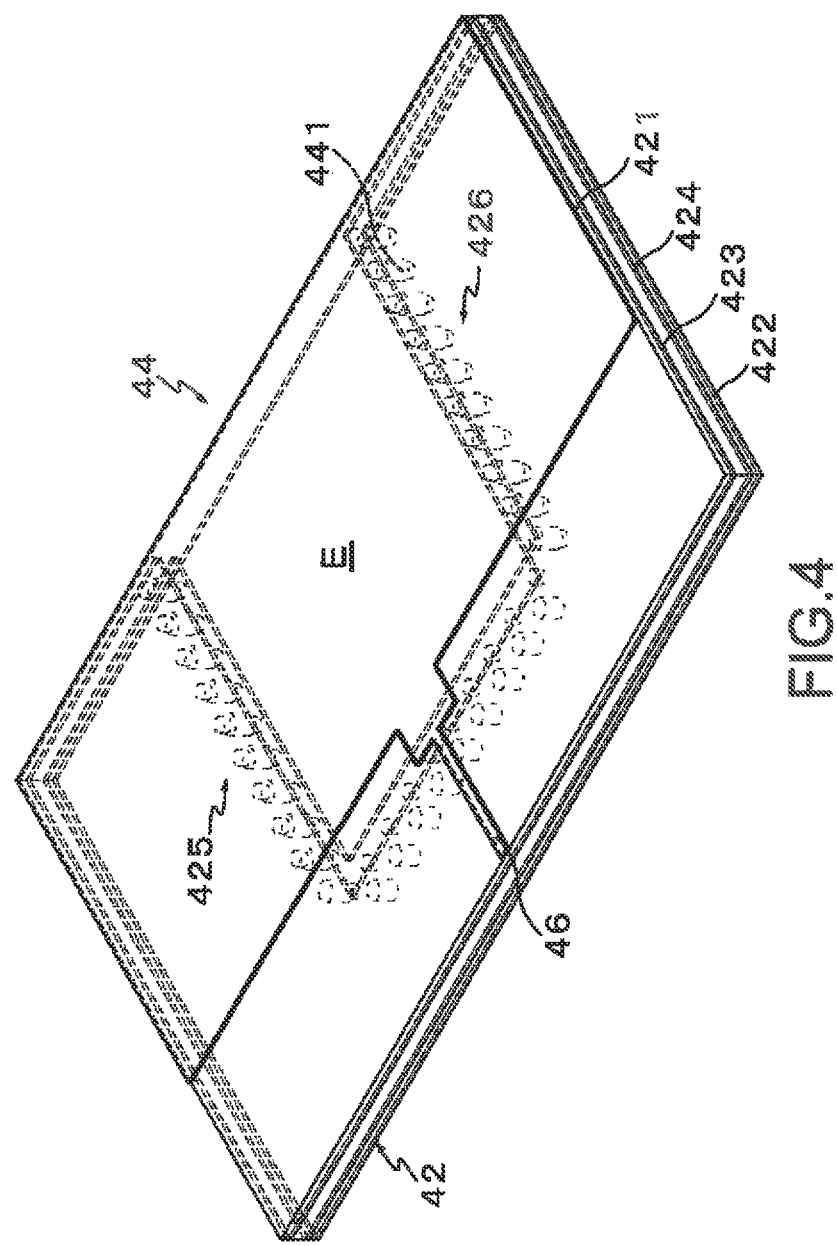
FIG. 4 is a perspective view showing an example of a configuration of a waveguide structure of a printed substrate.

A waveguide structure 44 of the printed substrate 42 is formed of a substrate integrated waveguide (SIW). FIG. 4 shows an example of a configuration of the waveguide structure 44 of the printed substrate 42. The waveguide structure 44 formed of the SIW is formed in a region E from which the second and third conductor layers 422, 423 of the substrate 42 have been removed. Specifically, waveguide structure 44 is formed of the two conductor layers 421, 422 formed on both main surfaces of the region E from which the second and third conductor layers 422, 423 have been removed and two conductor walls 425, 426 formed to be opposed to each other in perpendicular to the main surfaces and in the traveling direction of electromagnetic waves (propagation direction/x-direction). That is, the waveguide structure 44 becomes a pseudo-waveguide structure having functions of the equivalent to those of the rectangular waveguide, using the two conductor layers 421, 422 as upper and lower conductor walls and the two conductor walls 425, 426 as left and right conductor walls.

The two conductor walls 425, 426 serving as the left and right conductor walls are formed by a continuous array of columnar conductors, for example, via-holes 441 that electrically connect the two conductor layers 421, 422 formed on the both main surfaces of the substrate 42 and the two conductor layers 423, 424 formed between the both main surfaces. Although the via-holes 441 are exemplified here as the columnar conductors that form the two conductor walls, the conductors are not limited thereto. Also regarding the two conductor walls, they are not limited to have the configuration in which the columnar conductors are arranged in a continuous array. A configuration in which for example, two plate-like conductors are arranged to be opposed to each other in the traveling direction of electromagnetic waves is in principle possible.

The waveguide structure 44 of the substrate 42 is connected to a microstrip line (MSL) 46 via an impedance converter 45. Although, as the connector apparatus 40 according to this embodiment, one having the configuration in which the waveguide structure 44 is connected to the microstrip line 46 via the impedance converter 45 is exemplified, one having a configuration in which the waveguide structure 44 is not connected to the microstrip line 46 is also possible.

In one main surface of the substrate 42 (main surface/upper surface on a side on which the waveguide cable 41 is disposed), a through-hole 427 that penetrates the conductor layer 421 is formed. The coupling section 43 includes this through-hole 427 and electromagnetically couples the end portion of the waveguide cable 41 to the waveguide structure 44 through this through-hole 427. As shown in FIG. 5A, the through-hole 427 includes a slot formed between the two left and right conductor walls of the waveguide structure 44 in a direction perpendicular to the traveling direction of electromagnetic waves in the waveguide structure 44. Here, "perpendicular" means substantially perpendicular other than strictly perpendicular, and also deviations that are caused in design or manufacture are allowed.

A ridge waveguide 47 may have a structure including ridges on both upper and lower sides or may have a structure including a ridge on one of the upper and lower sides. FIG. 5A is a perspective view showing the upper-surface structure of the substrate (printed substrate) 42. FIG. 5B shows the upper-surface structure of the substrate 42 in a state in which a lower portion 47L of the ridge waveguide 47 to be described later is mounted.

The coupling section 43 includes the ridge waveguide 47 arranged between the through-hole (slot) 427 and the end portion of the waveguide cable 41. The ridge waveguide 47 performs impedance conversion for impedance matching between the waveguide cable 41 and the waveguide structure 44 and at the same time electromagnetically couples the end portion of the waveguide cable 41 to the waveguide structure 44. In this embodiment, for performing impedance conversion and electromagnetic coupling at the same time, the coupling section 43 has a so-called horizontal waveguide structure that holds the waveguide cable 41 in parallel to the substrate 42. Here, "parallel" means substantially parallel other than strictly parallel, and also deviations that are caused in design or manufacture are allowed.

The ridge waveguide 47 may have a structure including ridges on both upper and lower sides or may be have a structure including a ridge on one of the upper and lower sides (one side). Here, as shown in FIG. 3, the ridge waveguide 47 having a structure including ridges 471, 472 on the both upper and lower sides is used. For example, as shown in FIG. 6B, this ridge waveguide 47 is halved into an upper portion 47U including the upper ridge 471 and the lower portion 47L including the lower ridge 472. FIG. 6A is a perspective view showing the lower portion 47L of the ridge waveguide 47 in a reversed state. FIG. 6B is a perspective view showing the upper portion 47U and the lower portion 47L of the ridge waveguide 47 in the reversed state.

Note that the ridge waveguide 47 is not limited to have the halved structure and, as shown in FIG. 7A, a structure in which the upper portion 47U and the lower portion 47L are integral can also be employed. FIG. 7A is a sectional view showing a cross-sectional structure of the ridge waveguide having the integral structure including the ridges 471, 472 on both upper and lower sides. Although the ridge waveguide 47 is used as the member that performs impedance conversion and electromagnetic coupling at the same time, it is not limited to the ridge waveguide 47. For example, as shown in FIG. 7B, instead of the ridge waveguide 47, a rectangular waveguide 48 filled with dielectric material that is obtained by filling a tube 481 with dielectric material 482 can also be used. FIG. 7B is a sectional view showing the cross-sectional structure of the rectangular waveguide filled with the dielectric material.

The ridge waveguide 47 is housed in, for example, a metal guide member (hereinafter, referred to as "metal guide") 49 that defines the position while coupling the waveguide cable 41 with respect to the coupling section 43. Specifically, as shown in FIG. 6A, the lower portion 47L of the ridge waveguide 47 is formed to be integral with, for example, the metal guide 49. Note that it is not limited to the integral formation and the lower portion 47L of the ridge waveguide 47 and the metal guide 49 may be separately formed.

As shown in FIG. 6B, the upper portion 47U of the ridge waveguide 47 is assembled such that the ridges 471, 472 are opposed to the lower portion 47L of the ridge waveguide 47 formed integrally with the metal guide 49. At this time, the upper portion 47U of the ridge waveguide 47 has a width smaller than that of the lower portion 47L such that a communication hole 473 that communicates with an inside of the ridge waveguide 47 between the rear surface and the inner surface of the metal guide 49.

The ridge waveguide 47 housed in the metal guide 49 is positioned with respect to the substrate 41 such that, particularly as shown in FIG. 3, the communication hole 473 communicates with the through-hole 427 formed in the one main surface of the above-mentioned substrate 41. With this, the waveguide structure 44 of the substrate 41 is electromagnetically coupled to the end portion of the waveguide cable 41 through the channel of the through-hole 427→the communication hole 473→the ridge waveguide 47.

The metal guide 49 includes an insertion port 49A to which the waveguide cable 41 is inserted (coupled). A width $W_1$ of the inner wall of this insertion port 49A is set to be larger than a width of an electromagnetic wave's path of the coupling section 43 as shown in FIG. 6B, more specifically, a width $W_2$ of the inner wall of the ridge waveguide 47. By setting such a dimension relationship, it becomes possible to insert and remove the waveguide cable 41 into/from the metal guide 49. Furthermore, a length L of the metal guide 49 up to the ridge waveguide 47 is set to a quarter of the wavelength of electromagnetic waves (see FIG. 3).

As described above, the connector apparatus 40 according to this embodiment is configured to include the waveguide cable 41 formed of the dielectric waveguide, the substrate 42 including the waveguide structure 44 formed of the SIW, and the coupling section 43 including the ridge waveguide 47 that electromagnetically couples the end portion of the waveguide cable 41 to the waveguide structure. By employing this configuration, waveguide modes are coupled to each other between the substrate 42 and the waveguide cable 41.

Figure 8:
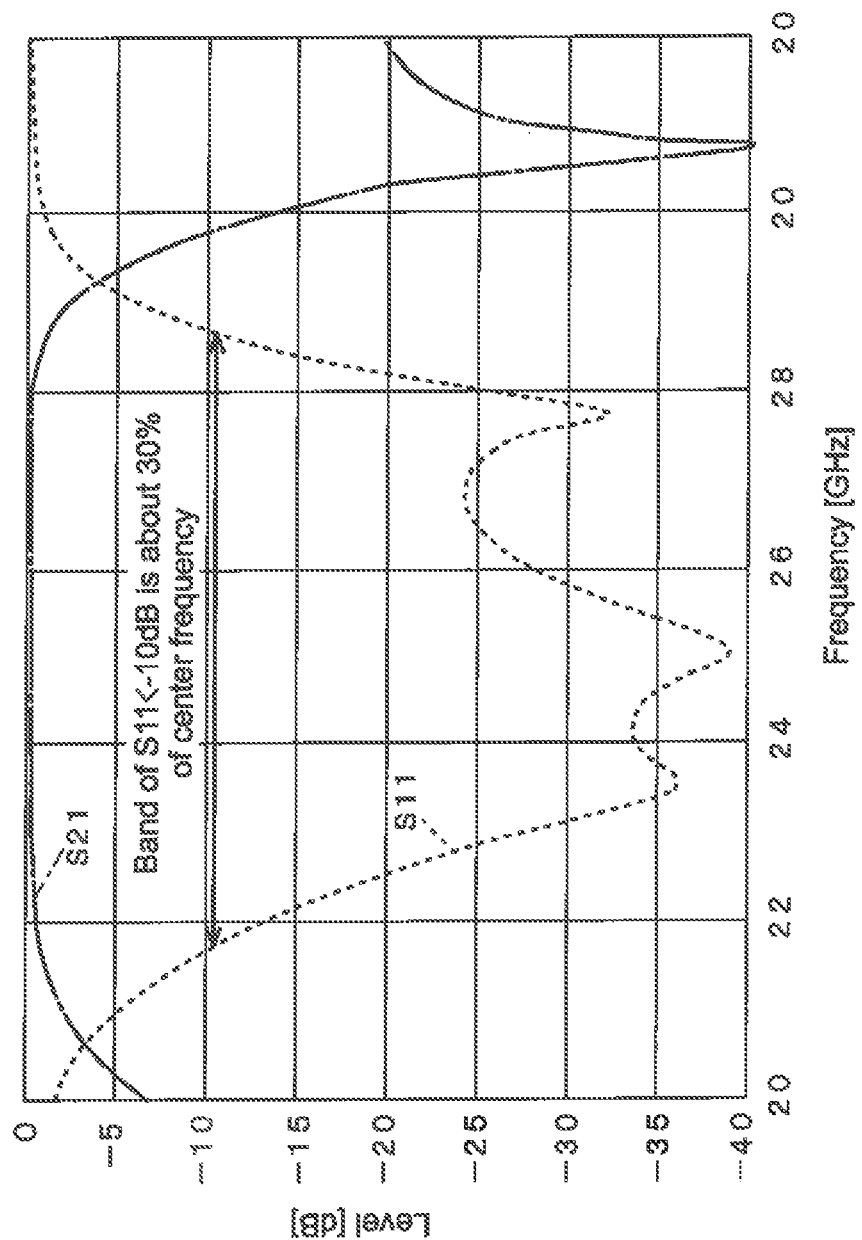
FIG. 8 is a characteristic diagram showing coupling characteristics in the case where the dielectric waveguide-microstrip line conversion structure is employed.
Figure 9:
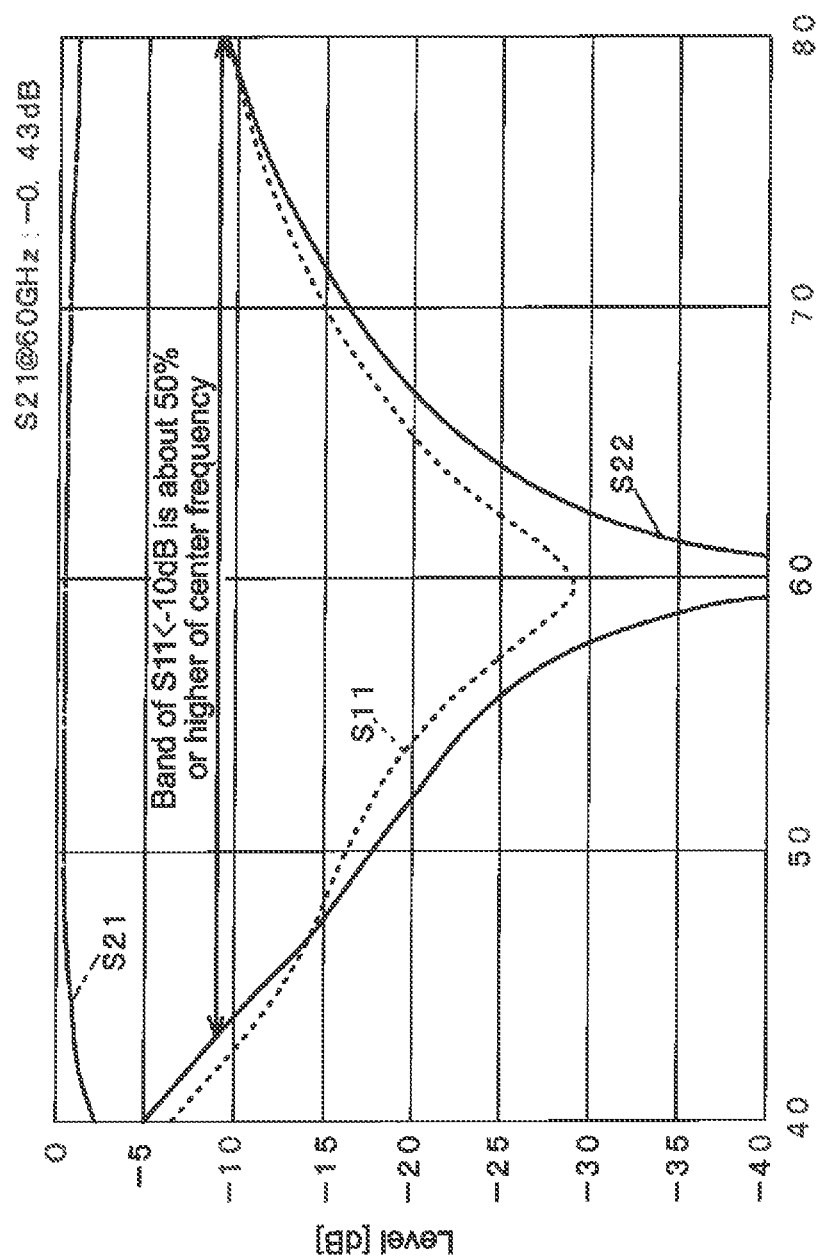
FIG. 9 is a characteristic diagram showing coupling characteristics of the connector apparatus according to this embodiment in which a structure of mutual coupling between waveguide modes is employed.

In the case of the mutual coupling between the waveguide modes, the electric field distribution is uniform, and hence electromagnetic waves can smoothly move. Furthermore, due to the mutual coupling between the waveguide modes, it becomes possible to widen the band of propagated electromagnetic waves. Specifically, in the case where a dielectric waveguide-microstrip line conversion structure in which a dielectric waveguide including, in a bottom surface thereof, a slot orthogonal to the traveling direction is fixed on the circuit board via the spacer is employed, as shown in FIG. 8, the band of S11<−10 dB occupies about 30% of a center frequency. In contrast, in the case where the structure of the mutual coupling between the waveguide modes is employed, as shown in FIG. 9, the band of S11<−10 dB can be widened to 50% or more over the center frequency. Regarding coupling characteristics shown in FIG. 8 and FIG. 9, S11, S22 are reflection coefficients of an S-parameter and S21 is a permeability coefficient of the S-parameter.

Figure 10:
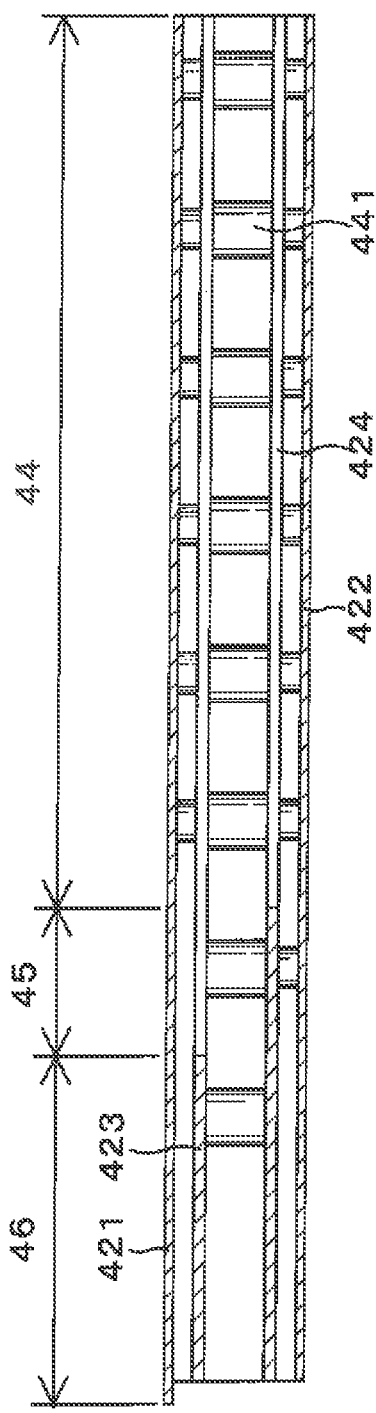
FIG. 10 is a magnified sectional view showing a structure between microstrip line-waveguide structure in FIG. 3 that is taken along the x-direction.
Figure 11:
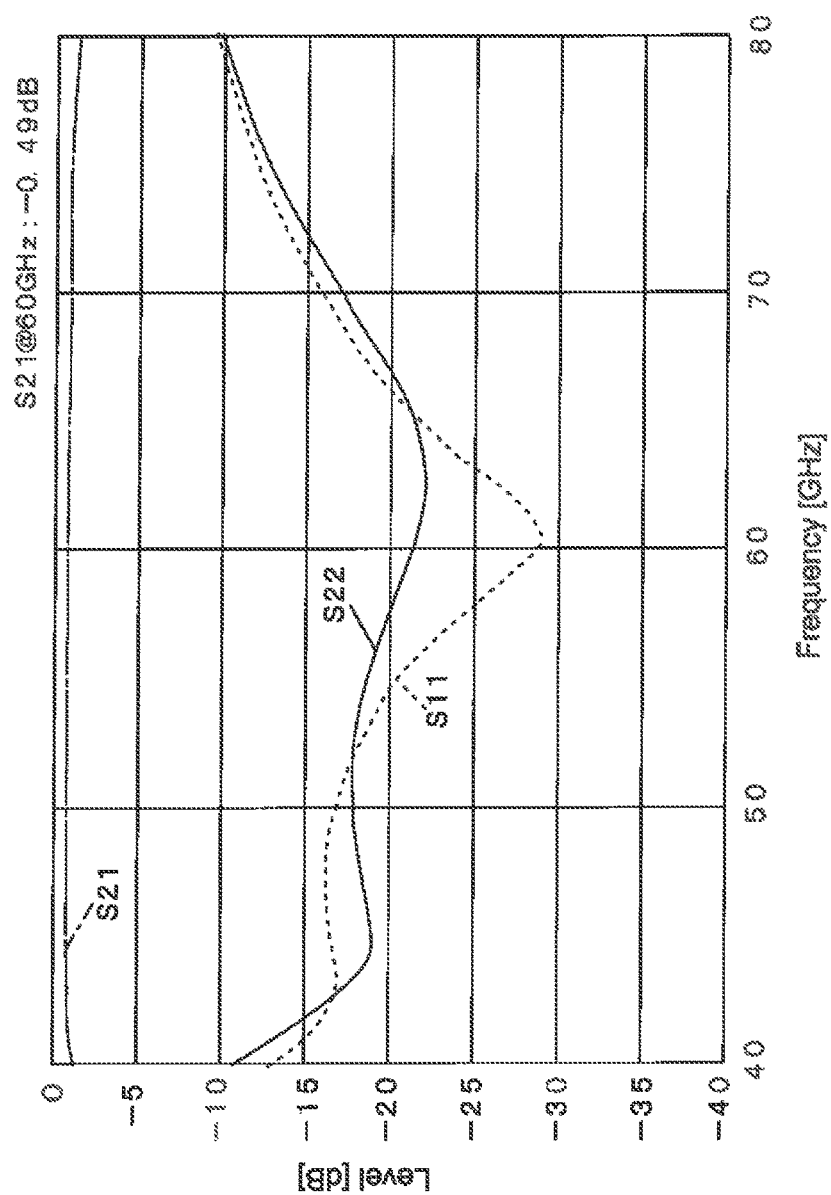
FIG. 11 is a characteristic diagram showing coupling characteristics between microstrip line-impedance converter.

FIG. 10 shows a structure between the microstrip line 46—the waveguide structure 44 in FIG. 3 that is taken along the x-direction in an enlarged state. In the microstrip line 46 of the printed substrate 42 including the four conductive layers, the first conductive layer 421 is a signal line and the second conductive layer 423 is a ground line. In the impedance converter 45, the first conductive layer 421 to the third conductive layer 424 are used. In the waveguide structure 44, in the region E (see FIG. 4) from which the second, third conductor layers 422, 423 have been removed, the first conductive layer 421 and the fourth conductive layer 422 are upper and lower conductor walls and the two conductor walls 425, 426 (see FIG. 4) formed by a continuous array of the via-holes 441 are the left and right conductor walls. Coupling characteristics between the microstrip line 46—the impedance converter 45 are shown in FIG. 11.

Furthermore, due to the mutual coupling between the waveguide modes, the structure of the coupling section 43 that electromagnetically couples the end portion of the waveguide cable 41 to the waveguide structure 44 can be simplified. Specifically, the reflection plate and the spacer are unnecessary and the simple structure in which the ridge waveguide 47 is housed in the metal guide 49 is employed, and hence the connector apparatus 40 including a small number of components and can be downsized can be realized. In the communication system 1 using the connector apparatus 40, simplification of the system can be expected.

Furthermore, as in this embodiment, MSL-waveguide conversion can be performed by connecting the microstrip line (MSL) 46 to the waveguide structure 44 formed of the SIW via the impedance converter 45. In addition, the substrate 42 has a structure including the waveguide structure 44, and hence the rear surface of the substrate 42 can be set to the ground. Therefore, in comparison with the connector apparatus (waveguide-microstrip line converting apparatus) in which it is necessary to form a transmission line in the rear surface of the substrate, there is an advantage in that no influences of the installation position of the substrate are imposed.

Figure 12:
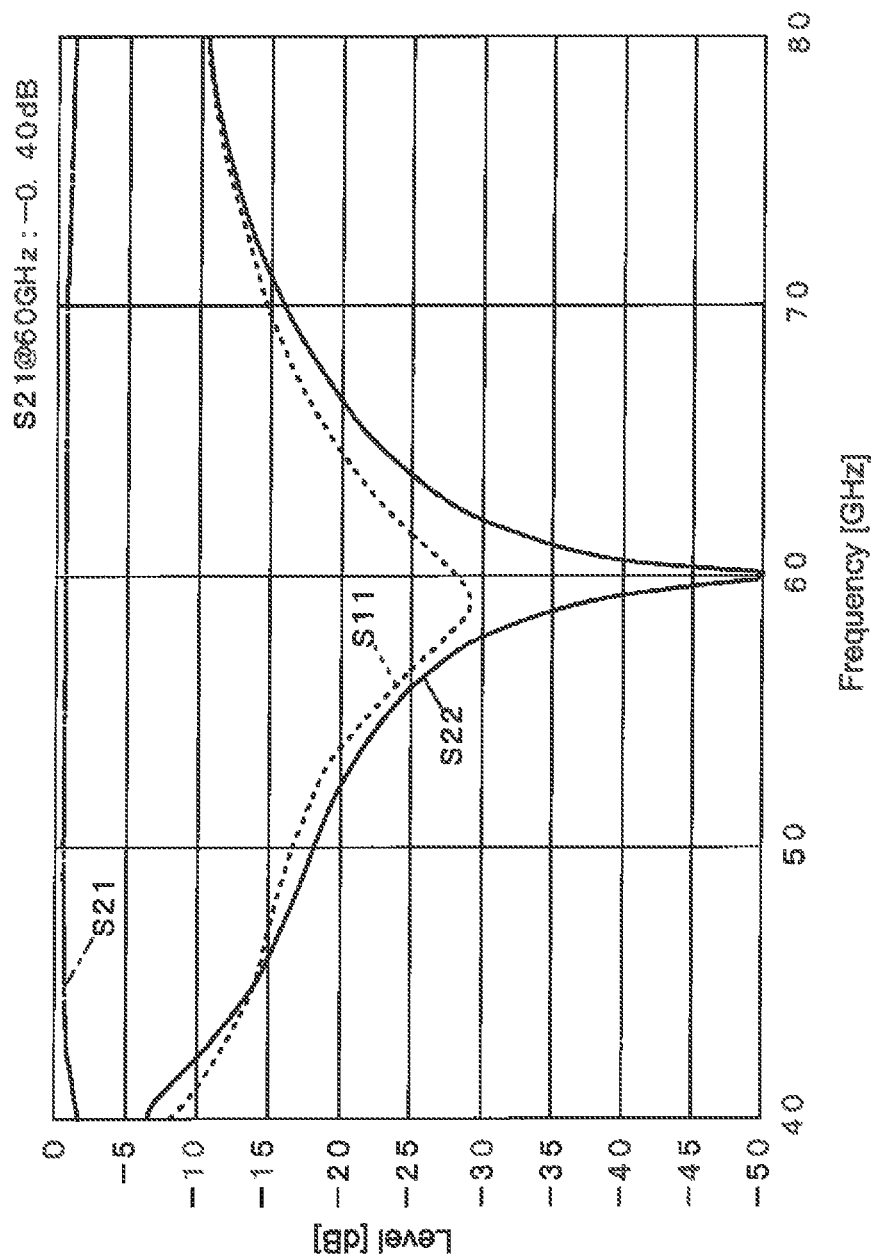
FIG. 12 is a characteristic diagram showing coupling characteristics in the case where the rectangular waveguide filled with the dielectric material is used instead of the ridge waveguide.

Furthermore, as described above, instead of the ridge waveguide 47, the rectangular waveguide 48 filled with the dielectric material shown in FIG. 7B can also be used for the coupling section 43. By using the rectangular waveguide 48 filled with the dielectric material instead of the ridge waveguide 47, there is an advantage in that dimensional accuracy requirements are less strict in comparison with the case of using the ridge waveguide 47 the ridge waveguide 47. FIG. 12 shows coupling characteristics in the case where the rectangular waveguide 48 filled with the dielectric material is used instead of the ridge waveguide 47.

Modified Example 1

Figure 13:
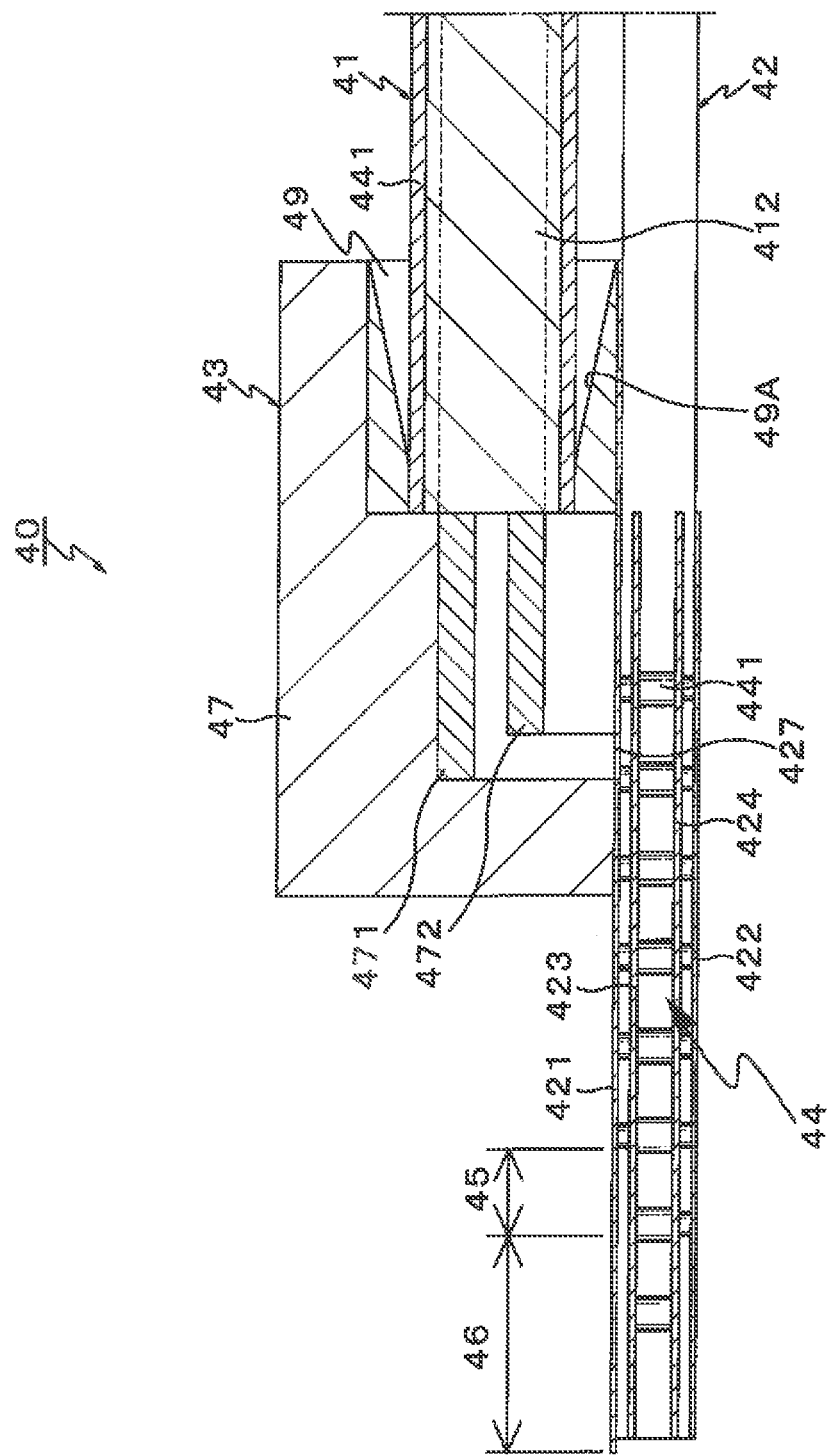
FIG. 13 is a sectional view showing the shape of an insertion port of a metal guide according to Modified Example 1.

In the above-mentioned embodiment, in order to enable the waveguide cable 41 to be removed and inserted from/into the metal guide 49, a configuration in which the width $W_1$ of the inner wall of the insertion port 49A is larger than the width $W_2$ of the inner wall of the ridge waveguide 47 is merely employed (see FIG. 6B). In Modified Example 1, as shown in FIG. 13, a configuration in which the inner wall of the insertion port 49A is set to have a taper shape having a width that becomes gradually narrower from the outside toward the coupling section 43, more specifically, the ridge waveguide 47. By setting the inner wall of the insertion port 49A to have the taper shape in this manner, the end of the waveguide cable 41 can be reliably guided into the coupling section 43 through the inner wall having the taper shape. With this, it becomes easy to mount the waveguide cable 41 and it is possible to bring the metal portion of the end of the waveguide cable 41 into reliable contact with the ridge waveguide 47. Thus, it is possible to reduce the loss and unnecessary radiation in the coupling portion on both.

Modified Example 2

Figure 14:
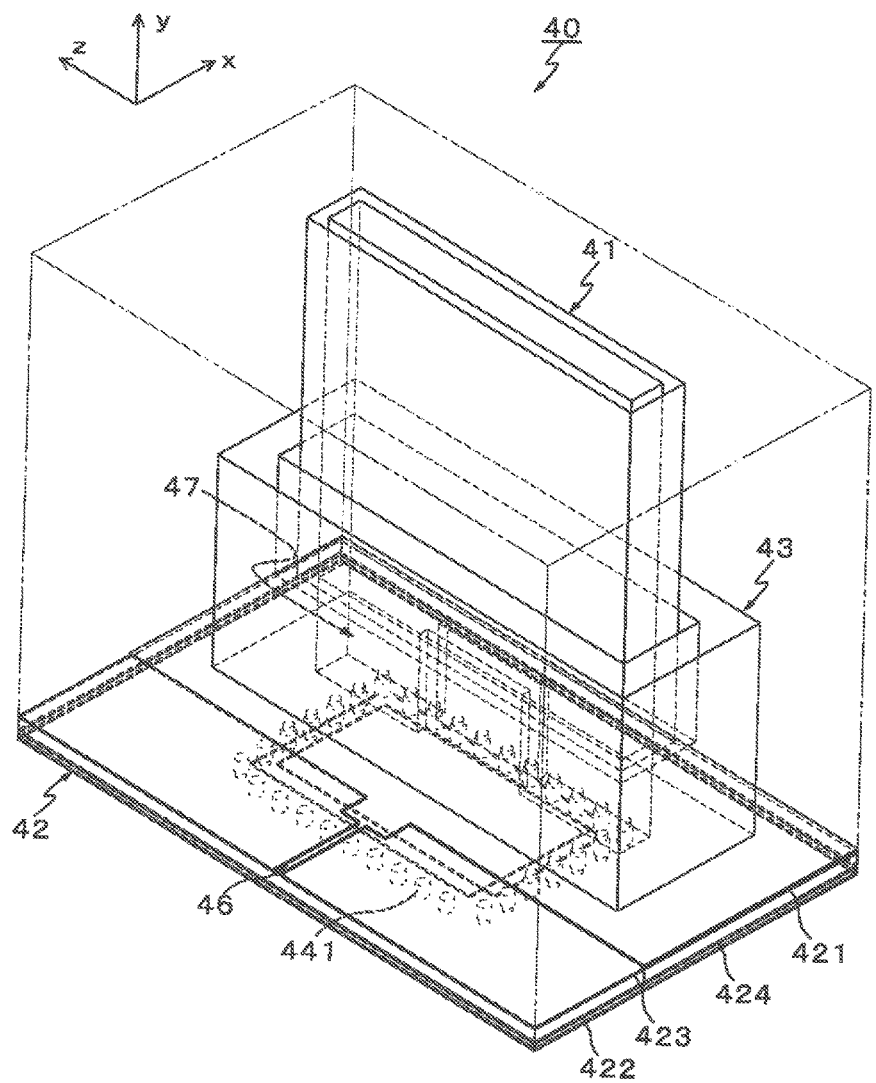
FIG. 14 is a perspective view schematically showing a configuration of a connector apparatus according to Modified Example 2.
Figure 15:
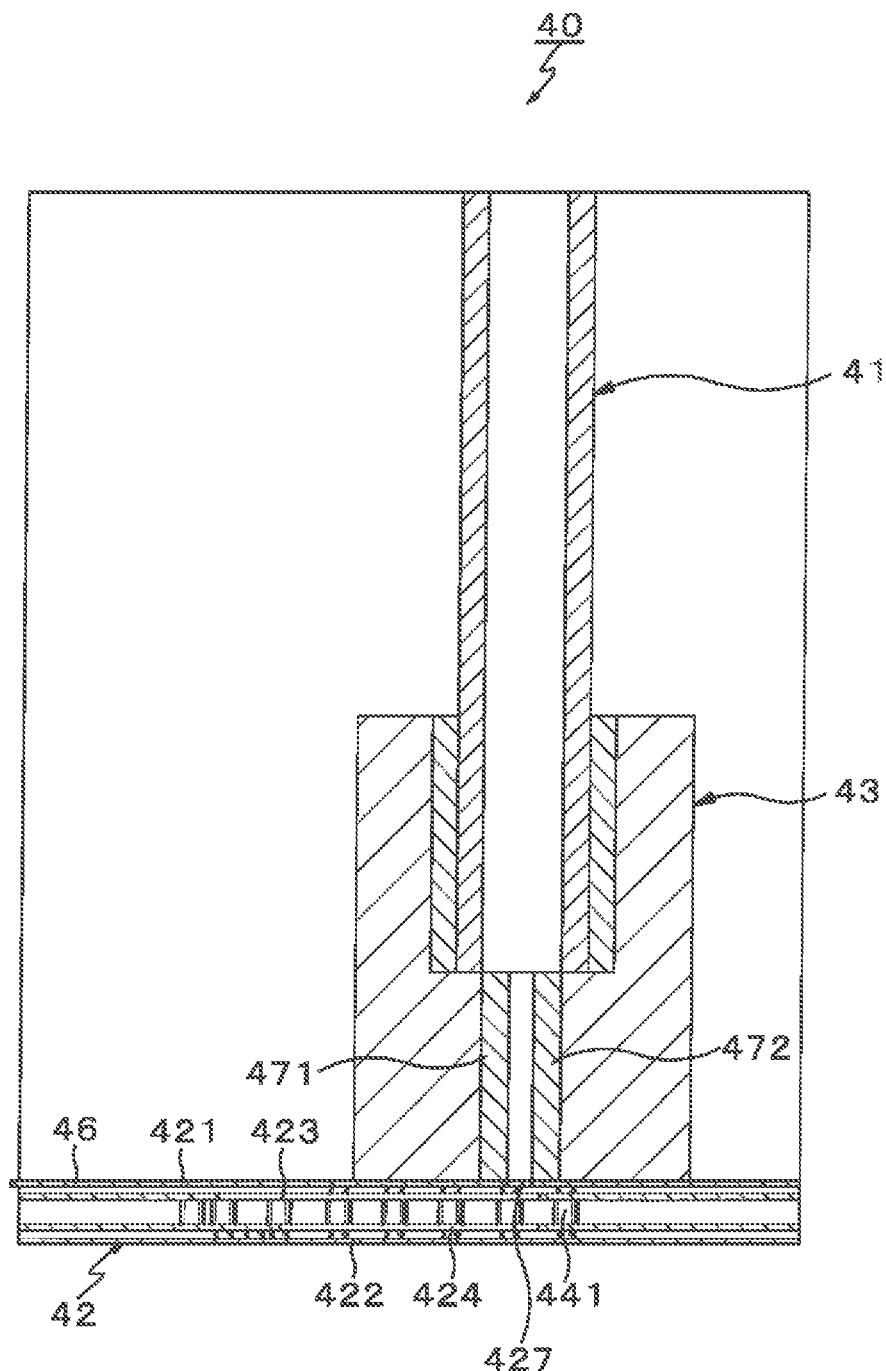
FIG. 15 is a sectional view showing a cross-sectional structure of the connector apparatus according to Modified Example 2 that is taken along a y-direction of FIG. 14.

Although, in the above-mentioned embodiment, the description has been made by exemplifying the horizontal waveguide structure that holds the waveguide cable 41 in parallel to the substrate 42, it is not limited thereto. For example, it is also possible to employ a so-called vertical waveguide structure that holds the waveguide cable 41 in particular to the substrate 42. Here, "perpendicular" means substantially perpendicular other than strictly perpendicular, and also deviations that are caused in design or manufacture are allowed. FIG. 14 is a perspective view schematically showing a configuration of the connector apparatus according to Modified Example 2. FIG. 15 is a sectional view showing a cross-sectional structure of a connector apparatus according to Modified Example 2 that is taken along the y-direction of FIG. 14.

Figure 16:
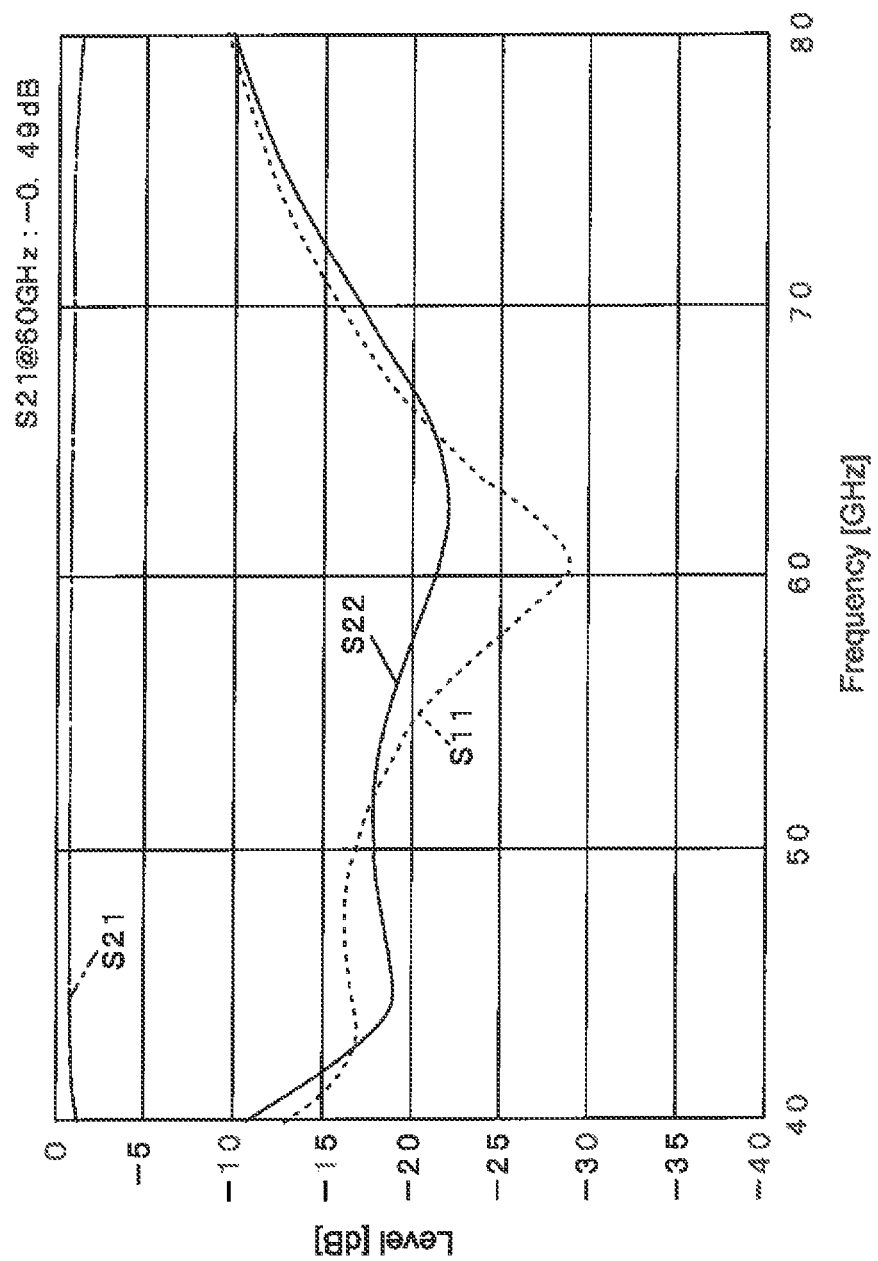
FIG. 16 is a characteristic diagram showing coupling characteristics of the connector apparatus according to Modified Example 2.

In the connector apparatus having the horizontal waveguide structure, as will be clear particularly from FIG. 3, the structure in which the through-hole 427 formed in the one main surface of the substrate 41 and the ridge waveguide 47 are held in communication with each other through the communication hole 473 is employed. In contrast, in the connector apparatus including the vertical waveguide structure of Modified Example 2, as will be clear particular from FIG. 15, a structure in which the through-hole 427 formed in the one main surface of the substrate 41 and the ridge waveguide 47 are directly opposed to each other to communicate with each other. FIG. 16 shows coupling characteristics of the connector apparatus according to Modified Example 2.

As will be clear from above, the coupling section 43 in the connector apparatus 40 of the present disclosure basically has a simple structure in which the ridge waveguide 47 (or the rectangular waveguide 48 filled with the dielectric material) is incorporated. Thus, due to the simple structure of the coupling section 43 of the connector apparatus of the present disclosure, a structure that can address both of the horizontal waveguide structure and the vertical waveguide structure is obtained.

Modified Example 3

In the above, the connector apparatus according to the first aspect that includes the waveguide cable 41, the substrate 42 including the waveguide structure, and the coupling section 43 that electromagnetically couples the end portion of the waveguide cable 41 to the waveguide structure is the connector apparatus 40 of the present disclosure. Note that, in the case where the connector apparatus including the waveguide cable 41, the substrate 42 including the waveguide structure, and the coupling section 43 is the connector apparatus according to the first aspect, the connector apparatus 40 of the present disclosure is not limited to the connector apparatus according to the first aspect and may be any one of connector apparatuses according to second to sixth aspects exemplified below.

(Second Aspect)

A configuration in which it is a connector apparatus according to a second aspect that is formed of the substrate 42 including the waveguide structure 44 may be employed. The connector apparatus according to the second aspect is used by the waveguide structure 44 being electromagnetically coupled to the end portion of the waveguide cable 41 through the coupling section 43.

(Third Aspect)

A configuration in which it is a connector apparatus according to a third aspect that is formed of the substrate 42 including the waveguide structure 44 and the coupling section 43 may be employed. The connector apparatus according to the third aspect is used by being electromagnetically coupled to the end portion of the waveguide structure 44 waveguide cable 41 through the coupling section 43.

(Fourth Aspect)

A configuration in which a connector apparatus according to a fourth aspect that is formed of the waveguide cable 41 and the coupling section 43 may be employed. The connector apparatus according to the fourth aspect is used by the end portion of the waveguide cable 41 being electromagnetically coupled to the waveguide structure 44 of the substrate 42 through the coupling section 43.

In fifth and sixth aspects, a case where the coupling section 43 is halved is assumed. As an example of halving, a case where, for example, the ridge waveguide 47 (see FIG. 6B) including the ridges 471, 472 on the both upper and lower sides is halved into the upper portion 47U and the lower portion 47L can be exemplified.

(Fifth Aspect)

A configuration in which it is a connector apparatus according to the fifth aspect that is formed of the substrate 42 including the waveguide structure 44 and a first coupling section electromagnetically coupled to the waveguide structure 44 (coupling section including upper portion 47U/coupling section including lower portion 47L) may be employed. The connector apparatus according to the fifth aspect is used by the first coupling section being electromagnetically coupled to the second coupling section (coupling section including lower portion 47L/coupling section including upper portion 47U) attached to the end portion of the waveguide cable 41.

(Sixth Aspect)

A configuration in which it is a connector apparatus according to the sixth aspect that is formed of the waveguide cable 41 and the second coupling section attached to the end portion of the waveguide cable 41 (coupling section including lower portion 47L/coupling section including upper portion 47U) may be employed. The connector apparatus according to the sixth aspect is used by the second coupling section being electromagnetically coupled to the first coupling section (coupling section including upper portion 47U/coupling section including lower portion 47L) electromagnetically coupled to the waveguide structure 44 of the substrate 42.

Note that the present disclosure may also take the following configurations.

[1] 《Connector Apparatus According to First Aspect》

A connector apparatus, including:

a waveguide cable;

a substrate including a waveguide structure; and a coupling section configured to electromagnetically couple an end portion of the waveguide cable to the waveguide structure.

[2] The connector apparatus according to [1], in which the waveguide structure comprises a substrate integrated waveguide.

[3] The connector apparatus according to [2], in which the substrate comprises a printed substrate with conductor layers formed on both main surfaces that are dielectric, and the waveguide structure comprises the two conductor layers formed on the both main surfaces of the printed substrate and two conductor walls formed perpendicular to the main surfaces and opposed to each other in a traveling direction of electromagnetic waves.

[4] The connector apparatus according to [3], in which the two conductor walls are formed by a continuous array of columnar conductors.

[5] The connector apparatus according to [4], in which the columnar conductors comprise via-holes that electrically connects the two conductor layers formed on the both main surfaces of the printed substrate.

[6] The connector apparatus according to any one of [3] to [5], in which the coupling section includes a through-hole that penetrates the conductor layer of the one main surface of the printed substrate, and electromagnetically couples the end portion of the waveguide cable to the waveguide structure via the through-hole.

[7] The connector apparatus according to [6], in which the through-hole comprises a slot formed between the two conductor walls in a direction perpendicular to the traveling direction of electromagnetic waves.

[8] The connector apparatus according to [6] or [7], in which the coupling section includes a ridge waveguide provided between the through-hole and the end portion of the waveguide cable.

[9] The connector apparatus according to [6] or [7], in which
the coupling section includes a rectangular waveguide filled with dielectric material provided between the through-hole and the end portion of the waveguide cable.

[10] The connector apparatus according to any one of [1] to [9], in which
the waveguide cable is a dielectric waveguide cable with the waveguide being filled with dielectric material.

[11] The connector apparatus according to any one of [1] to [10], in which
an electromagnetic wave transmitted from the waveguide structure of the substrate to the waveguide cable through the coupling section is a high-frequency signal.

[12] The connector apparatus according to [11], in which
the high-frequency signal is a millimeter-wave band signal.

[13] The connector apparatus according to any one of [1] to [12], in which
the coupling section holds the waveguide cable in parallel to the substrate.

[14] The connector apparatus according to any one of [1] to [12], in which
the coupling section holds the waveguide cable perpendicular to the substrate.

[15] The connector apparatus according to any one of [1] to [14], further including
a guide member configured to define the position while coupling the waveguide cable with respect to the coupling section.

[16] The connector apparatus according to [15], in which
the guide member includes an insertion port into which the waveguide cable is inserted.

[17] The connector apparatus according to [16], in which
a width of an inner wall of the insertion port is set to be larger than a width of an electromagnetic wave's path of the coupling section.

[18] The connector apparatus according to [17], in which
the inner wall of the insertion port has a taper shape having a width that becomes gradually narrower from an outside toward the coupling section.

[19] The connector apparatus according to any one of [1] to [18], in which
the waveguide structure of the substrate is connected to a microstrip line via an impedance converter.

[20]《Communication System Connector Apparatus According to First Aspect》
A communication system, including:
a transmitter configured to transmit high-frequency signals;
a receiver configured to receive high-frequency signals;
a waveguide cable configured to transmit high-frequency signals between the transmitter and the receiver; and
a connector apparatus configured to connect between at least one of the transmitter and the receiver to the waveguide cable, wherein the connector apparatus further includes
the waveguide cable,
a substrate including a waveguide structure, and
a coupling section configured to electromagnetically couple an end portion of the waveguide cable to the waveguide structure.

[21] 《Connector Apparatus According to Second Aspect》
A connector apparatus including
a substrate including a waveguide structure, the connector apparatus being used by the waveguide structure being electromagnetically coupled to an end portion of a waveguide cable.

[22] 《Connector Apparatus According to Third Aspect》
A connector apparatus including:
a substrate including a waveguide structure; and
a coupling section configured to electromagnetically couple the waveguide structure to an end portion of a waveguide cable.

[23] 《Connector Apparatus According to Fourth Aspect》
A connector apparatus, including:
a waveguide cable; and
a coupling section that, with respect to a substrate including a waveguide structure, electromagnetically couples an end portion of the waveguide cable to the waveguide structure of the substrate.

[24] 《Connector Apparatus According to Fifth Aspect》
A connector apparatus, including:
a substrate including a waveguide structure; and
a first coupling section that is electromagnetically coupled to the waveguide structure, the connector apparatus being used by the first coupling section being electromagnetically coupled to a second coupling section attached to an end portion of a waveguide cable.

[25] 《Connector Apparatus According to Sixth Aspect》
A connector apparatus, including:
a waveguide cable; and
a second coupling section that is attached to an end portion of the waveguide cable, the connector apparatus being used by the second coupling section being electromagnetically coupled to a first coupling section electromagnetically coupled to a waveguide structure of a substrate.

DESCRIPTION OF SYMBOLS 1 communication system
10 transmitter
11 signal generator
20 receiver
21 signal recovering section
30, 41 waveguide cable
40, 50 connector apparatus
42 substrate (printed substrate)
43 coupling section
44 waveguide structure (substrate integrated waveguide)
45 impedance converter
46 microstrip line (MSL)
47 ridge waveguide
47U upper portion of ridge waveguide
47L lower portion of ridge waveguide
48 rectangular waveguide filled with dielectric material
49 metal guide (guide member)
100 first communication apparatus
111 oscillator
112, 212 multiplier
113, 211, 213 buffer
200 second communication apparatus
427 through-hole (slot)
471, 472 ridge
473 communication hole

The invention claimed is:
1. A connector apparatus, comprising:
a waveguide cable comprising an end portion;
a substrate including a waveguide structure, wherein the waveguide structure of the substrate is configured to transmit an electromagnetic wave to the waveguide cable; and a coupling section configured to electromagnetically couple the end portion of the waveguide cable to the waveguide structure, wherein the coupling section includes a ridge waveguide and a communication hole, wherein the communication hole extends between the substrate and the end portion of the waveguide cable, and wherein the waveguide structure comprises:
- a first conductor layer and a second conductor layer, wherein the first conductor layer is on an upper surface of the substrate and the second conductor layer is on a lower surface of the substrate; and
- a first conductor wall and a second conductor wall, wherein the first conductor wall comprises a first continuous array of columnar conductors and the second conductor wall comprises a second continuous array of columnar conductors,
- wherein the first continuous array of columnar conductors comprises a plurality of first via-holes and the second continuous array of columnar conductors comprises a plurality of second via-holes, and
- wherein the plurality of first via-holes of the first continuous array of columnar conductors are parallel to the plurality of second via-holes of the second continuous array of columnar conductors.

2. The connector apparatus according to claim 1, wherein the waveguide structure further comprises a substrate integrated waveguide.

3. The connector apparatus according to claim 2,
wherein: the substrate comprises a printed substrate,
the upper surface of the substrate and the lower surface of the substrate are dielectric,
the upper surface of the substrate is on a side with the waveguide cable,
the first conductor wall and the second conductor wall are perpendicular to the upper surface of the substrate and the lower surface of the substrate, and
the first conductor wall is opposed to the second conductor wall in a traveling direction of the electromagnetic wave.

4. The connector apparatus according to claim 1, wherein the plurality of first via-holes and the plurality of second via-holes are configured to electrically connect at least one of the first conductor layer or the second conductor layer with the upper surface and the lower surface of the substrate.

5. The connector apparatus according to claim 1,
wherein the coupling section further includes a through-hole,
wherein the through-hole extends through the first conductor layer, and
wherein the coupling section is further configured to electromagnetically couple the end portion of the waveguide cable to the waveguide structure via the through-hole.

6. The connector apparatus according to claim 5, wherein the through-hole comprises a slot between the first conductor wall and the second conductor wall in a direction perpendicular to a traveling direction of the electromagnetic wave.

7. The connector apparatus according to claim 5, wherein the ridge waveguide is between the through-hole and the end portion of the waveguide cable.

8. The connector apparatus according to claim 5, wherein the coupling section further includes a rectangular waveguide filled with dielectric material, and wherein the rectangular waveguide is between the through-hole and the end portion of the waveguide cable.

9. The connector apparatus according to claim 1, wherein the waveguide cable is a dielectric waveguide cable filled with dielectric material.

10. The connector apparatus according to claim 1, wherein the electromagnetic wave, transmitted from the waveguide structure of the substrate to the waveguide cable, is a high-frequency signal, and wherein the electromagnetic wave is transmitted via the coupling section.

11. The connector apparatus according to claim 10, wherein the high-frequency signal is a millimeter-wave band signal.

12. The connector apparatus according to claim 1, wherein the coupling section is further configured to hold the waveguide cable parallel to the substrate.

13. The connector apparatus according to claim 1, wherein the coupling section is further configured to hold the waveguide cable perpendicular to the substrate.

14. The connector apparatus according to claim 1, further comprising:
a guide member configured to define a position of the ridge waveguide with respect to the coupling section.

15. The connector apparatus according to claim 14, wherein the guide member includes an insertion port configured to receive the waveguide cable.

16. The connector apparatus according to claim 15, wherein a first width of an inner wall of the insertion port is larger than a second width of a path of the electromagnetic wave of the coupling section.

17. The connector apparatus according to claim 16, wherein the inner wall of the insertion port has a taper shape such that the first width of the inner wall of the insertion port is narrower from an outside of the insertion port towards the coupling section.

18. The connector apparatus according to claim 1, wherein the waveguide structure of the substrate is connected to a microstrip line via an impedance converter.

19. The connector apparatus according to claim 1, further comprising:
a guide member configured to electromagnetically couple with the waveguide cable,
wherein a part of the guide member is in contact with the ridge waveguide, and wherein a length of the part of the guide member is based on a wavelength of the electromagnetic wave.

20. A communication system, comprising:
a transmitter configured to transmit high-frequency signals;
a receiver configured to receive the high-frequency signals;
a waveguide cable configured to transmit the high-frequency signals between the transmitter and the receiver; and
a connector apparatus configured to connect at least one of the transmitter or the receiver to the waveguide cable,
wherein the connector apparatus includes:
the waveguide cable that comprises an end portion;
a substrate including a waveguide structure, wherein the waveguide structure of the substrate is configured to transmit an electromagnetic wave to the waveguide cable; and
a coupling section configured to electromagnetically couple the end portion of the waveguide cable to the waveguide structure, wherein the coupling section includes a ridge waveguide and a communication hole, wherein the communication hole extends between the substrate and the end portion of the waveguide cable, and wherein the waveguide structure comprises:

a first conductor layer and a second conductor layer, wherein the first conductor layer is on an upper surface of the substrate and the second conductor layer is on a lower surface of the substrate; and a first conductor wall and a second conductor wall, wherein the first conductor wall comprises a first continuous array of columnar conductors and the second conductor wall comprises a second continuous array of columnar conductors, wherein the first continuous array of columnar conductors comprises a plurality of first via-holes and the second continuous array of columnar conductors comprises a plurality of second via-holes, and wherein the plurality of first via-holes of the first continuous array of columnar conductors are parallel to the plurality of second via-holes of the second continuous array of columnar conductors.

21. The connector apparatus according to claim 19, wherein the length of the part of the guide member is equal to a quarter of the wavelength of the electromagnetic wave.

* * * * *